United States Patent
Ko et al.

(10) Patent No.: US 10,263,213 B2
(45) Date of Patent: Apr. 16, 2019

(54) DISPLAY DEVICE INCLUDING A SEALANT

(71) Applicant: SAMSUNG DISPLAY CO., LTD., Yongin-si, Gyeonggi-do (KR)

(72) Inventors: Moo Soon Ko, Seoul (KR); Young Woo Park, Seongnam-si (KR); Il Jeong Lee, Seoul (KR); Sang-Mok Hong, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 82 days.

(21) Appl. No.: 15/368,896

(22) Filed: Dec. 5, 2016

(65) Prior Publication Data

US 2017/0294618 A1    Oct. 12, 2017

(30) Foreign Application Priority Data

Apr. 11, 2016    (KR) .................. 10-2016-0044382

(51) Int. Cl.
| | |
|---|---|
| *H01L 29/04* | (2006.01) |
| *H01L 29/10* | (2006.01) |
| *H01L 31/00* | (2006.01) |
| *H01L 51/52* | (2006.01) |
| *H01L 27/32* | (2006.01) |

(52) U.S. Cl.
CPC ...... *H01L 51/5237* (2013.01); *H01L 27/3276* (2013.01); *H01L 51/5246* (2013.01)

(58) Field of Classification Search
CPC ............. H01L 51/5237; H01L 27/3276; H01L 51/5246
USPC .................................................... 257/40, 59
See application file for complete search history.

(56) References Cited

U.S. PATENT DOCUMENTS

| | | | |
|---|---|---|---|
| 2005/0184927 A1* | 8/2005 | Kwak ................. | H01L 27/3276 345/45 |
| 2006/0139505 A1* | 6/2006 | Yoshinaga ............ | G02F 1/1345 349/43 |
| 2008/0252205 A1* | 10/2008 | Young ................. | H01L 51/0006 313/504 |

(Continued)

FOREIGN PATENT DOCUMENTS

| | | |
|---|---|---|
| KR | 10-0959106 | 5/2010 |
| KR | 10-0995071 | 11/2010 |

(Continued)

*Primary Examiner* — Lex Malsawma
*Assistant Examiner* — Eric W Jones
(74) *Attorney, Agent, or Firm* — F. Chau & Associates, LLC

(57) ABSTRACT

A display device including a first substrate including a display area that displays an image and a peripheral area, in which no image is displayed, surrounding the display area. The display device further includes a plurality of pixels disposed in the display area. The display device additionally includes a first metal layer disposed above the first substrate in the peripheral area, and the first metal layer including a plurality of openings. The display device further includes a sealant disposed above the first metal layer, and surrounding the plurality of pixels. The display device additionally includes a plurality of second metal layers disposed above the first substrate and below the first metal layer in the peripheral area, and respectively overlapping the openings of the first metal layer. A part of the sealant is disposed in the plurality of openings.

20 Claims, 14 Drawing Sheets

(56) References Cited

U.S. PATENT DOCUMENTS

| | | | | |
|---|---|---|---|---|
| 2010/0066232 A1* | 3/2010 | Kim | ................... | H01L 27/3276 313/317 |
| 2013/0207117 A1* | 8/2013 | An | ................... | H01L 27/3276 257/71 |
| 2014/0346445 A1* | 11/2014 | Cho | ................... | H01L 51/5246 257/40 |
| 2015/0060893 A1* | 3/2015 | Cho | ................... | H01L 51/5246 257/88 |
| 2015/0108438 A1* | 4/2015 | Kim | ................... | H01L 27/3258 257/40 |
| 2015/0125666 A1* | 5/2015 | Jeon | ................... | H01L 51/5246 428/192 |

FOREIGN PATENT DOCUMENTS

| | | |
|---|---|---|
| KR | 10-1503775 | 3/2015 |
| KR | 10-2015-0081006 | 7/2015 |

* cited by examiner

DISPLAY DEVICE INCLUDING A SEALANT

CROSS-REFERENCE TO RELATED APPLICATION

This application claims priority under 35 U.S.C. § 119 to Korean Patent Application No. 10-2016-0044382, filed on Apr. 11, 2016 in the Korean Intellectual Property Office, the disclosure of which is incorporated by reference herein in its entirety.

TECHNICAL FIELD

Exemplary embodiments of the present inventive concept relate to a display device, and more particularly, to a display device including a sealant.

DISCUSSION OF THE RELATED ART

Display devices are widely used to visually display data. Currently many types of display devices exist, some of which include a liquid crystal display (LCD), a plasma display panel PDP, an organic light emitting diode device (OLED device), a field effect display (FED), an electrophoretic display device, and the like.

The OLED device typically includes two electrodes and an organic emission layer interposed therebetween. In the OLED device, an electron injected from one electrode and a hole injected from the other electrode are recombined in the organic emission layer to generate an exciton. As an electron of the exciton relaxes, a photon is emitted.

Since the OLED device has a self-luminance characteristic and does not require a separate light source, thickness and weight thereof may be reduced. Further, since the OLED device has characteristics such as low power consumption, high luminance, and a high response speed, the OLED device is perceived as an advanced display device.

In an OLED display, a display panel includes a plurality of organic light emitting elements which are surrounded by a sealant disposed in a peripheral area of the display to prevent permeation of moisture, oxygen, or other contaminants, into the organic light emitting elements. In addition, a sealing substrate is disposed above the sealant to cover the same so that the display panel is sealed.

However, when outgassing occurs between the sealant disposed in the peripheral area of the display panel and an insulation layer disposed below the sealant, the sealant may be lifted up from the insulation layer as the sealed nature of the OLED device may not allow for dissipation of the outgassing.

SUMMARY

According to an exemplary embodiment of the present inventive concept, a display device includes a first substrate including a display area that displays an image and a peripheral area, in which no image is displayed, surrounding the display area. The display device further includes a plurality of pixels disposed in the display area. The display device additionally includes a first metal layer disposed above the first substrate in the peripheral area, and the first metal layer including a plurality of openings. The display device further includes a sealant disposed above the first metal layer, and surrounding the plurality of pixels. The display device additionally includes a plurality of second metal layers disposed above the first substrate and below the first metal layer in the peripheral area, and respectively overlapping the openings of the first metal layer. A part of the sealant is disposed in the plurality of openings.

In an exemplary embodiment of the present inventive concept, a total area of the second metal layers is less than a total area of the plurality of openings.

In an exemplary embodiment of the present inventive concept, the second metal layer includes a plurality of support portions that are each disposed in parallel with one another. The second metal layer further includes a plurality of connection portions disposed between a pair of support portions that are adjacent to one another, among the plurality of support portions, and connecting the pair of support portions to one another.

In an exemplary embodiment of the present inventive concept, each of the plurality of support portions has a polygonal plane shape.

In an exemplary embodiment of the present inventive concept, a total surface area of each of the plurality of support portions is greater than a total surface area of the plurality of connection portions.

In an exemplary embodiment of the present inventive concept, the display device further includes a first insulation layer disposed in the peripheral area of the first substrate and covering the second metal layer. The display device further includes a second insulation layer disposed between the first insulation layer and the sealant in the peripheral area of the first substrate, and covering the first metal layer disposed on the first insulation layer.

In an exemplary embodiment of the present inventive concept, the first insulation layer and the second insulation layer each includes a plurality of through-holes that penetrate the first and second insulation layers.

In an exemplary embodiment of the present inventive concept, the plurality of through-holes pass through the openings of the first metal layer.

In an exemplary embodiment of the present inventive concept, the plurality of through-holes overlap the second metal layers.

In an exemplary embodiment of the present inventive concept, the sealant extends through the plurality of through-holes and contacts the second metal layer.

In an exemplary embodiment of the present inventive concept, the display device further includes a plurality of gate wires disposed above the display area of the first substrate, each extending in a first direction, and arranged in parallel with one another in a second direction that crosses the first direction. The display device additionally includes a plurality of second gate wires each extending in the first direction, and disposed between a pair of first gate wires that are adjacent to one another among the plurality of gate wires, respectively.

In an exemplary embodiment of the present inventive concept, the plurality of first gate wires and the plurality of second gate wires are provided in different layers.

In an exemplary embodiment of the present inventive concept, the first metal layer is disposed on a same layer as that of the plurality of first gate wires, and the second metal layer is disposed on a same layer as that of the plurality of second gate wires.

In an exemplary embodiment of the present inventive concept, the first metal layer is disposed on a same layer as that of the plurality of second gate wires, and the second metal layer is disposed on a same layer as that of the plurality of first gate wires.

In an exemplary embodiment of the present inventive concept, a pixel of the plurality of pixels includes an organic light emitting element.

In an exemplary embodiment of the present inventive concept, the display device further includes a second substrate disposed above the first substrate, and, together with the first sealant and the first substrate, enclosing the plurality of pixels.

In an exemplary embodiment of the present inventive concept, the sealant includes an upper sealant disposed above the first metal layer, and a lower sealant extending from the upper sealant and disposed in the plurality of openings.

According to an exemplary embodiment of the present inventive concept, a display device includes a substrate divided into a first area and a second area surrounding the first area. The display device further includes a plurality of pixels disposed in the first area, and a bottom metal layer disposed above the first substrate in the second area. The display device further includes a first insulation layer disposed on the bottom metal layer, and a top metal layer disposed on the insulation layer and including an opening. The bottom metal layer overlaps the opening. The display device additionally includes a sealant disposed above the top metal layer. Part of the sealant extends to the bottom metal layer through the opening.

In an exemplary embodiment of the present inventive concept, the top metal layer includes a plurality of openings provided above the bottom metal layer. The bottom metal layer includes a plurality of portions separated from one another. Each portion is overlapping an opening of the plurality of openings.

In an exemplary embodiment of the present inventive concept, the plurality of portions of the top metal layer includes a plurality of support portions that are disposed in parallel with one another. The plurality of portions of the top metal layer further includes a plurality of connection portions disposed between a pair of support portions that are adjacent to one another among the plurality of support portions and connecting the pair of support portions to one another.

In an exemplary embodiment of the present inventive concept, the display device further includes a second insulation layer disposed on the first insulation layer and covering the top metal layer. The display device additionally includes a plurality through-holes extending from the sealant and stopping at an upper surface of the bottom metal layer. The sealant extends through the plurality of through-holes and contacts the bottom metal layer.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EXEMPLARY EMBODIMENTS

Exemplary embodiments of the present inventive concept will be described more fully hereinafter with reference to the accompanying drawings.

It will be understood that when an element such as a layer, film, region, or substrate is referred to as being "on" another element, it can be directly on the other element or intervening elements may also be present. Hereinafter, a display device according to an exemplary embodiment of the present inventive concept will be described with reference to FIG. 1 to FIG. 9.

Figure 1:
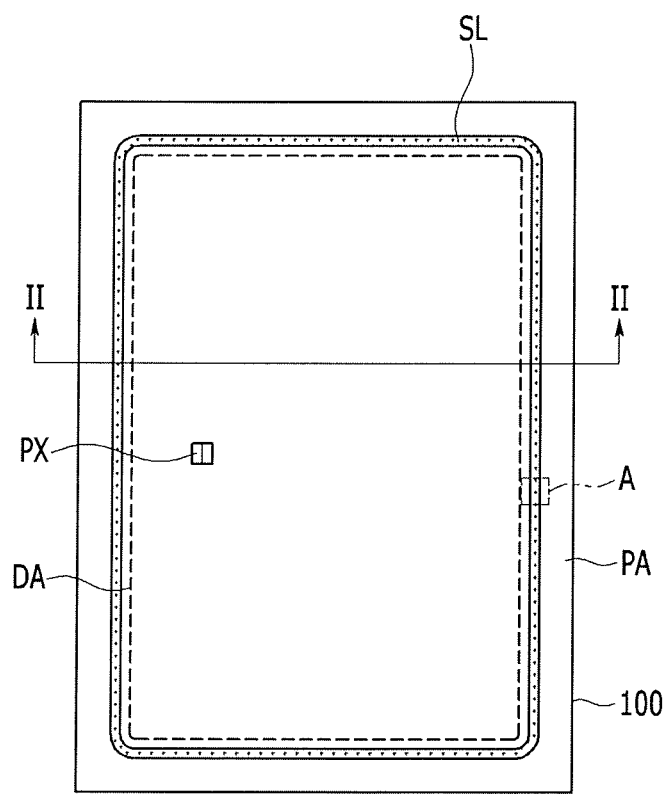
FIG. 1 is a top plan view of a display device according to an exemplary embodiment of the present inventive concept.
Figure 2:
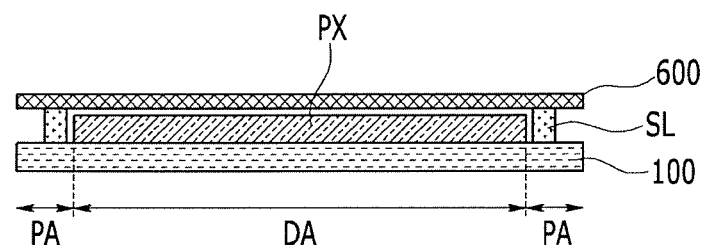
FIG. 2 is a cross-sectional view of FIG. 1, taken along line II-II.

FIG. 1 is a top plan view of a display device according to an exemplary embodiment of the present inventive concept, and FIG. 2 is a cross-sectional view of FIG. 1, taken along line II-II.

Referring to FIG. 1 and FIG. 2, a display device according to an exemplary embodiment of the present inventive concept is divided into a display area DA and a peripheral area PA.

The display area DA is an area on the display device where an image is displayed. The display area DA may include a first substrate 100 and a plurality of pixels PX, which may be disposed in the display area DA. The plurality of pixels may emit light to display an image in the display area DA. The plurality of pixels may be described as organic light emitting elements, but exemplary embodiments of the present inventive concept are not limited thereto. For example, the plurality of pixels may be provided as liquid crystal display elements, electrophoretic display elements, or the like. A detailed configuration of the display area DA including the pixels PX of an exemplary embodiment of the present inventive concept will be described later.

In addition, the peripheral area PA is an area on the display device that surrounds the display area DA. Further, a gate driver, a light emission control driver, a data driver, or the like may be disposed in the peripheral area PA.

Further, a sealant SL may be disposed in the peripheral PA while surrounding the plurality of pixels PX. As shown in FIG. 2, the sealant SL may be disposed between the first substrate 100 and a second substrate 600 which are parallel to one another.

The sealant SL may bond the first substrate 100 and the second substrate 600 to one another. Thus, the sealant SL can seal the plurality of pixels PX in the display area between the first substrate 100 and the second substrate 600. For example, the first substrate 100 and the second substrate 600 may cover a bottom and top surface of the plurality of pixels. As a result, permeation of external oxygen and moisture through a side direction of the display device can be prevented. Here, the side direction is a direction that is parallel to an extension direction of the first substrate 100 or the second substrate 600, and includes a direction from right to left and a direction from left to right of FIG. 2. For example, the side direction is a horizontal direction with respect to FIG. 2.

The sealant SL may include a frit. Additionally, the sealant SL may include a light hardening material. The light hardening material included in the sealant SL may include, for example, an epoxy acrylate resin, a polyester acrylate resin, a urethane acrylate resin, a polybutadiene acrylate resin, a silicon acrylate resin, or the like.

In this case, when the sealant SL is irradiated by ultraviolet (UV) rays, a laser beam, visible rays, or the like, the sealant SL is hardened such that the sealant SL and the second substrate 600 are bonded to one another. A layering structure of the sealant SL of an exemplary embodiment of the present inventive concept will be described later.

The second substrate 600 bonded to the first substrate 100 by the sealant SL may include a transparent inorganic material or flexible plastic. For example, the second substrate 600 may include a rigid glass substrate, a quartz substrate, or the like. In addition, the second substrate 600 may include a flexible transparent resin substrate.

Figure 3:
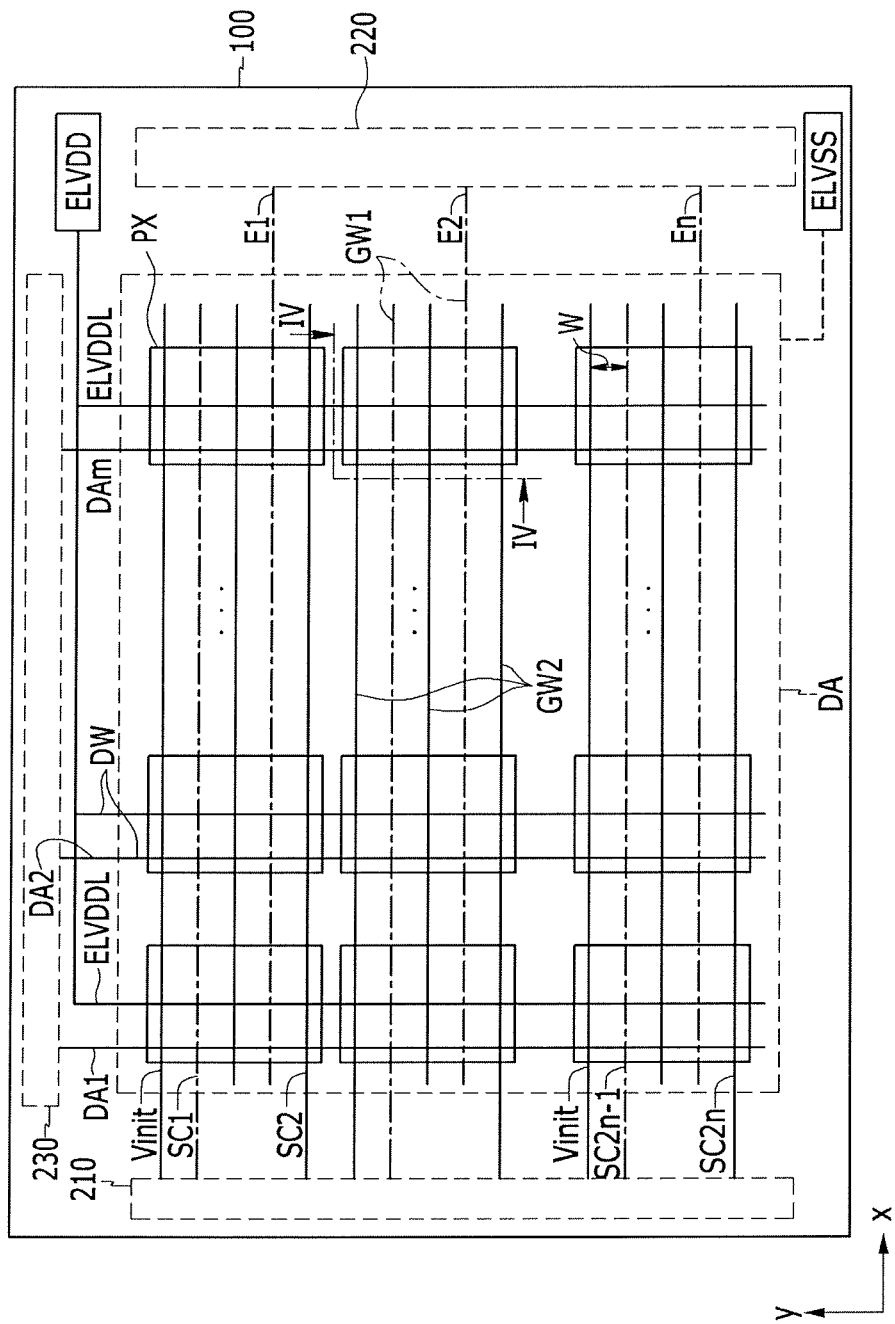
FIG. 3 schematically illustrates pixel and wire configurations in a display area of FIG. 1, according to an exemplary embodiment of the present inventive concept.
Figure 4:
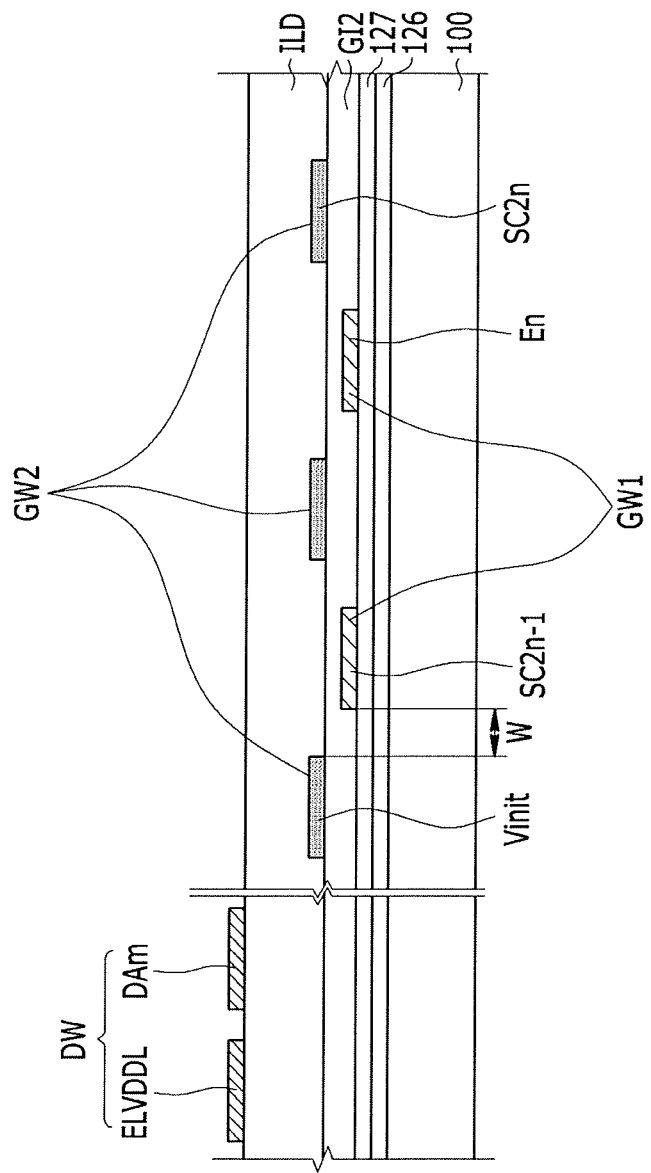
FIG. 4 is a cross-sectional view of FIG. 3, taken along line IV-IV.

FIG. 3 schematically shows pixel and wire configurations of the display area of FIG. 1, according to an exemplary embodiment of the present inventive concept, and FIG. 4 is a cross-sectional view of FIG. 3, taken along line IV-IV.

Hereinafter, the display area DA provided on the first substrate 100 will be described in detail with reference to FIG. 3 and FIG. 4.

According to an exemplary embodiment of the present inventive concept, the display area DA may include first gate wires GW1, second gate wires GW2, data wires DW, and a plurality of pixels PX.

A gate driver 210 sequentially supplies a scan signal corresponding to a control signal supplied from an external control circuit to first (e.g., even-numbered) scan lines SC2 to SC2n or second (e.g., odd-numbered) scan lines SC1 to SC2(n–1) included in the first gate wires GW1 or the second gate wires GW2. For example, the external control circuit may include a timing controller or the like. Subsequently, the plurality of pixels PX are sequentially selected by the scan signal and then the selected pixels PX receive a data signal. Here, the gate driver 210 shown in FIG. 3 is disposed in a driving chip that is disposed on a flexible film disposed on one end of the first substrate 100.

The first gate wires GW1 are disposed on a gate insulating layer 127. The gate insulating layer is disposed on a substrate buffer layer 126, and the buffer layer 126 is disposed on the first substrate 100. Further, the first gate wires GW1 extend in a first direction (e.g., an x-axis direction). The first gate wires GW1 may include the second scan line SC2(n–1) and light emission control lines E1 to En.

The second scan line SC2(n–1) may be connected to the gate driver 210, and may receive the scan signal from the gate driver 210. The light emission control line En may be connected with a light emission control driver 220, and may receive a light emission control signal from the light emission control driver 220. Here, like the gate driver 210, the light emission control driver 220 shown in FIG. 3 is disposed on the driving chip that is disposed on the flexible film.

The second gate wires GW2 are disposed above the first gate wires GW1, and a first insulation layer GI2 is interposed therebetween. Further, the second gate wires GW2 extend in the first direction (e.g., the x-axis direction). The second gate wires GW2 may include a first scan line SC2n and an initialization power line Vinit.

In an exemplary embodiment of the present inventive concept, the first gate wires GW1 and the second gate wires GW2 do not overlap one another.

The first scan line SC2n may be connected to the gate driver 210, and may receive the scan signal from the gate driver 210. The initialization power line Vinit may be connected to the gate driver 210, and may receive initialization power from the gate driver 210.

In an exemplary embodiment of the present inventive concept, the initialization power line Vinit may receive the initialization power from the gate driver 210, but the initialization power line Vinit may be connected with an additional element and may receive the initialization power therefrom.

The light emission control driver 220 may sequentially supply the light emission control signal to the light emission control line En corresponding to a control signal supplied from an external source. For example, the light emission control driver 220 may receive a control signal from a timing controller (or the like), and based on the control signal, the light emission control driver 220 may sequentially supply the light emission control signal to the light emission control line En. Subsequently, the light emission control signal can control light emission of the plurality of pixels PX.

For example, the light emission control signal may control the light emission time of the plurality of pixels PX. Further, the light emission control signal may control the duration of the light emission of the plurality of pixels PX. However, the light emission control driver 220 may be omitted depending on an internal structure of the plurality of pixels PX.

A data driver 230 may supply the data signal to a data line DAm among the data wires DW. The supplied data signal may correspond to the control signal supplied from the external source such as the timing controller or the like.

The data signal supplied to the data line DAm is supplied to one pixel among a plurality of pixels PX that is selected by the scan signal when the scan signal is supplied to the first scan line SC2n or the second scan line SC2(n–1). Subsequently, the plurality of pixels PX are charged with a voltage corresponding to the data signal, and the plurality of pixels PX emit light with a corresponding luminance. Here, like the gate driver 210, the data driver 230 shown in FIG. 3 is disposed on the driving chip on the flexible film.

The data wires DW are disposed on the second gate wires GW2, and a second insulation layer ILD may be interposed therebetween. Further, the data wires DW may extend in a second direction (e.g., a y-axis direction) that crosses the first direction (e.g., the x-axis direction). The data wires DW may include data lines DA1 to DAm and a driving power line ELVDDL.

The data line DAm may be connected to the data driver 230, and the data line DAm may receive a data signal from the data driver 230. The driving power line ELVDDL may be connected to an external first power source ELVDD, and the driving power line ELVDDL may receive driving power from the first power source ELVDD.

In this case, the driving power line ELVDDL and the data line DAm may be disposed on the same layer, which may be, for example, the second insulation layer ILD. In an exemplary embodiment of the present inventive concept, the driving power line ELVDDL and the data line DAm may be disposed on different layers. For example, the driving power line ELVDDL may be disposed on the same layer as the first gate wires GW1, and the data line DAm may be disposed on the same layer as the second gate wires GW2.

In an exemplary embodiment of the present inventive concept, the driving power line ELVDDL may be disposed on the same layer as the second gate wires GW2, and the data line DAm may be disposed on the same layer as the first gate wires GW1.

The display area DA may include the first gate wires GW1, the second gate wires GW2, and the plurality of pixels PX disposed in areas where the data lines DW cross one another. Here, each pixel of the plurality of pixels PX may include an organic light emitting element that emits light with a luminance that corresponds to a driving current that corresponds to the data signal. Each pixel of the plurality of pixels PX may further include a pixel circuit controlling the driving current flowing to the organic light emitting element. The pixel circuit may be connected to the first gate wires GW1, the second gate wires GW2, and the data wires DW. The organic light emitting element may be connected to the pixel circuit. The pixel PX is described as an organic light emitting element, but as in the previous description, the pixel PX used in the display device of an exemplary embodiment of the present inventive concept may be provided as a liquid crystal display element, an electrophoretic display element, or the like.

Such an organic light emitting element of the display area DA may be connected to the external first power source ELVDD, and the pixel circuit may be interposed therebetween. Further, the organic light emitting element may also be connected to the second power source ELVSS. Each of the first power source ELVDD and the second power source ELVSS supplies driving power and common power to the plurality of pixels PX of the display area DA. Further, the plurality of pixels PX emit light with a luminance that corresponds to the driving current, which corresponds to the data signal, that flows to the organic light emitting element from the first power source ELVDD according to the supplied driving power and common power.

As described, the display device according to the exemplary embodiment of the present inventive concept may include first gate wires GW1 that include a second scan line SC2(n−1). The display device may further include a light emission control line En, which are gate wires that are disposed in an area where they are not overlapping one another and extend across the plurality of pixels PX along the first direction (e.g., the x-axis direction). The display device may further include a second gate wires GW2 that include a first scan line SC2n and an initialization power line Vinit.

The first gate wires GW1 and the second gate wires GW2 may be respectively disposed on different layers, and a first insulation layer GI2 may be interposed therebetween, rather than being disposed on the same layer. Since a distance W between neighboring gate wires disposed on different layers can be narrowed, many more pixels PX can be arranged in the same area. As a result, a display device having high resolution can be implemented.

Figure 5:
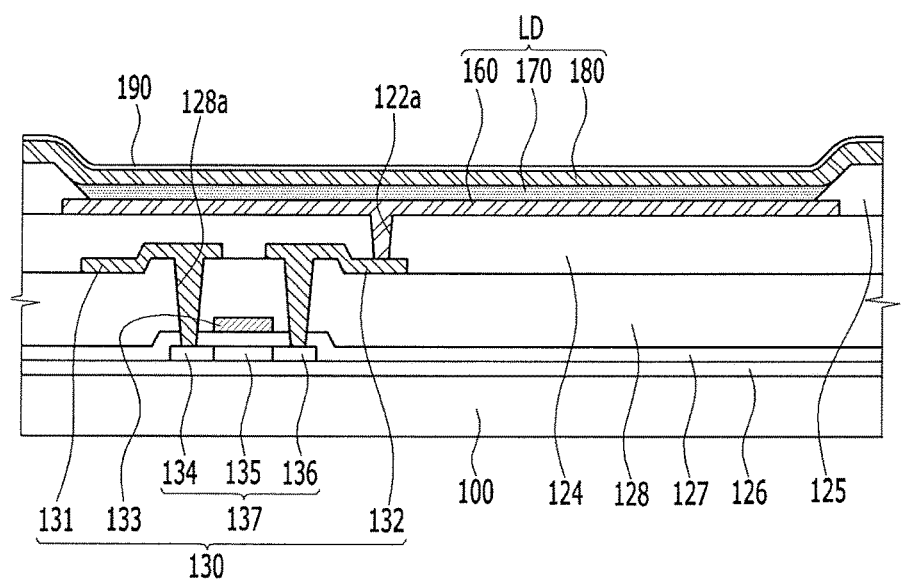
FIG. 5 is a cross-sectional view of an organic light emitting element forming a single pixel of FIG. 3, according to an exemplary embodiment of the present inventive concept.

FIG. 5 is a cross-sectional view of the organic light emitting element that is include in a single pixel of FIG. 3.

A structure of an organic light emitting element that is include in each pixel of the plurality of pixels PX of an exemplary embodiment of the present inventive concept will be described in detail with reference to FIG. 5.

The first substrate 100 included in the organic light emitting element may be made of an inorganic material, a metal material, an organic material such as a resin, or the like. Further, the first substrate 100 may transmit light or block light, and may be flexible.

In addition, a substrate buffer layer 126 is disposed above the first substrate 100. The substrate buffer layer 126 prevents permeation of an impure element and flattens the surface thereof.

In this case, the substrate buffer layer 126 may include various materials that can perform the above-stated functions. For example, the substrate buffer layer 126 may include one of a silicon nitride (SiNx) layer, a silicon oxide ($SiO_x$) layer, and a silicon oxynitride ($SiO_xN_y$) layer. However, in an exemplary embodiment of the inventive concept, the substrate buffer layer 126 might may be omitted depending on the type and process conditions of the first substrate 100.

A driving semiconductor layer 137 may be disposed above the substrate buffer layer 126. The driving semiconductor layer 137 may include polysilicon. In addition, the driving semiconductor layer 137 includes a channel area 135 in which impurities are not doped, and source and drain areas 134 and 136 which are doped at respective sides of the channel area 135. In this case, a doped ion material is a P-type impurity such as boron (B). Further, diborane ($B_2H_6$) is a compound that is generally used as the doped ion material. Here, the impurity may vary depending on the type of a thin film transistor.

A gate insulation layer 127, including a silicon nitride ($SiN_x$) or a silicon oxide ($SiO_x$), is disposed above the driving semiconductor layer 137.

Gate wires including a driving gate electrode 133 are disposed above the gate insulation layer 127. In addition, the driving gate electrode 133 overlaps at least a part of the driving semiconductor layer 137, particularly, the channel area 135.

In addition, an interlayer insulating layer 128 that covers the driving gate electrode 133 is disposed above the gate insulation layer 127. A contact hole 128a that contacts the source area 134 and the drain area 136 of the driving semiconductor layer 137 is disposed in the gate insulation layer 127 and the interlayer insulating layer 128.

Similar to the gate insulation layer 127, the interlayer insulating layer 128 may include a ceramic-based material such as a silicon nitride ($SiN_x$) or a silicon oxide ($SiO_x$).

In addition, data lines including a driving source electrode 131 and a driving drain electrode 132 are disposed above the interlayer insulating layer 128. Further, the driving source electrode 131 and the driving drain electrode 132 are respectively connected with the source area 134 and the drain area 136 of the driving semiconductor layer 137 through the contact hole 128a that penetrates the gate insulation layer 127 and the interlayer insulating layer 128.

As described, the driving semiconductor layer 137, the driving gate electrode 133, the driving source electrode 131, and the driving drain electrode 132 are included in a driving thin film transistor 130. The configuration of the driving thin film transistor 130 is not limited to the aforementioned example, and may be variously modified.

In addition, a planarization layer 124 that covers the driving source electrode 131 and the driving drain electrode 132 is disposed above the interlayer insulating layer 128. The planarization layer 124 may flatten a step made by the driving source electrode 131 and the driving drain electrode 132 in order to increase light emission efficiency of an organic light emitting element to be disposed thereon. Further, the planarization layer 124 includes a via hole 122a that partially exposes the drain electrode 132.

The planarization layer 124 may include one or more materials of a polyacrylate resin, an epoxy resin, a phenolic resin, a polyamide resin, a polyimide resin, an unsaturated polyester resin, a poly(phenylene ether) resin, a poly(phenylene sulfide) resin, and benzocyclobutene (BCB).

The exemplary embodiment of the present inventive concept is not limited to the above-stated structure, and one of the planarization layer 124 and the interlayer insulating layer 128 may be omitted.

In this case, a first electrode of an organic light emitting element LD, for example, a pixel electrode 160, is disposed above the planarization layer 124. For example, an organic light emitting diode (OLED) display includes a plurality of pixel electrodes 160 disposed in their respective pixels. Each pixel electrode of the plurality of pixel electrodes 160 is separated by a particular distance from one another. The pixel electrode 160 is electrically connected to the drain electrode 132 through the electrode via hole 122a of the planarization layer 124.

The pixel electrode 160 may include a transparent conductive metal such as indium tin oxide (ITO), indium zinc oxide (IZO), zinc oxide (ZnO), or $In_2O_3$(indium oxide), or a reflective metal such lithium (Li), calcium (Ca), lithium fluoride/calcium (LiF/Ca), lithium fluoride/aluminum (LiF/Al), aluminum (Al), silver (Ag), magnesium (Mg), or gold (Au).

In addition, a pixel defining layer 125 may be disposed above the planarization layer 124. The pixel defining layer 125 may include an opening where an organic emission layer 170 may be disposed. The pixel defining layer 125 may define a pixel area where the organic emission layer 170 is disposed.

In this case, the pixel electrode 160 is disposed corresponding to the opening of the pixel defining layer 125. For example, the pixel electrode 160 may be disposed in the opening of the pixel defining layer 125. In an exemplary embodiment of the present inventive concept, the pixel electrode 160 might not always be disposed in the opening of the pixel defining layer 125, and a part of the pixel electrode 160 may be disposed below the pixel defining layer 125 so that the pixel defining layer 125 is overlapped.

The pixel defining layer 125 may include a resin such as a polyacrylate resin and a polyimide resin, or a silica-based inorganic material.

The organic emission layer 170 is disposed above the pixel electrode 160.

In addition, a second electrode, for example, a common electrode 180, may be disposed above the organic emission layer 170. In this way, an organic light emitting diode LD including the pixel electrode 160, the organic emission layer 170, and the common electrode 180 may be formed.

The common electrode 180 may include a transparent conductive material such as indium tin oxide (ITO), indium zinc oxide (IZO), zinc oxide (ZnO), or indium oxide ($In_2O_3$), or a transflective conductive material.

An overcoat 190 that protects the common electrode 180 by covering the same may be disposed as an organic layer on the common electrode 180.

Figure 6:
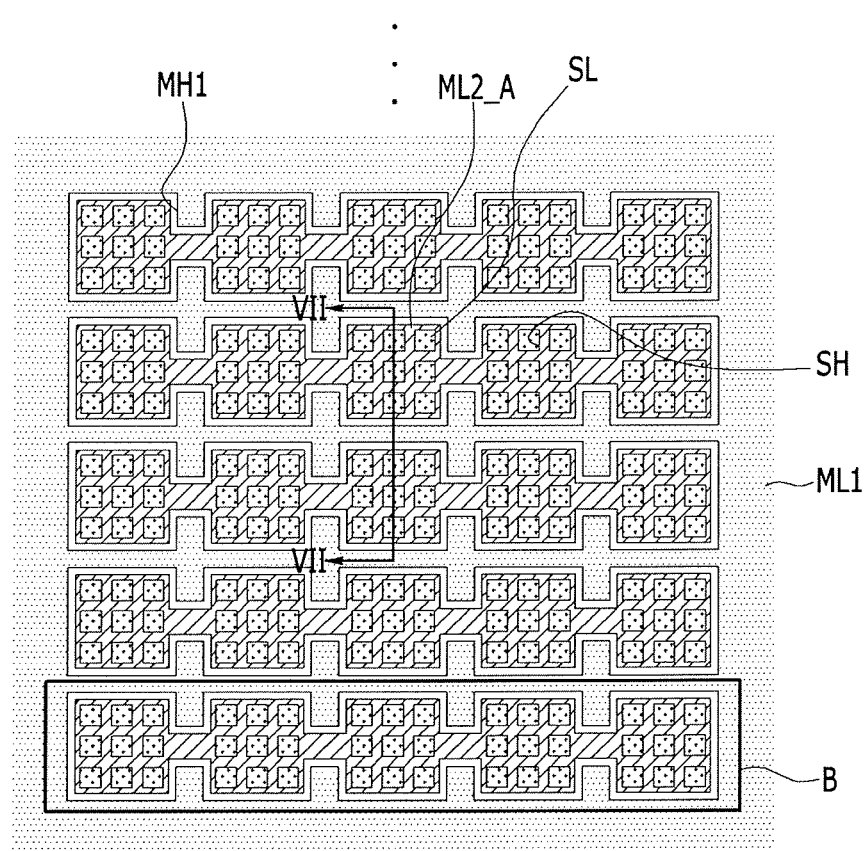
FIG. 6 is an enlarged view of area A of FIG. 1.
Figure 7:
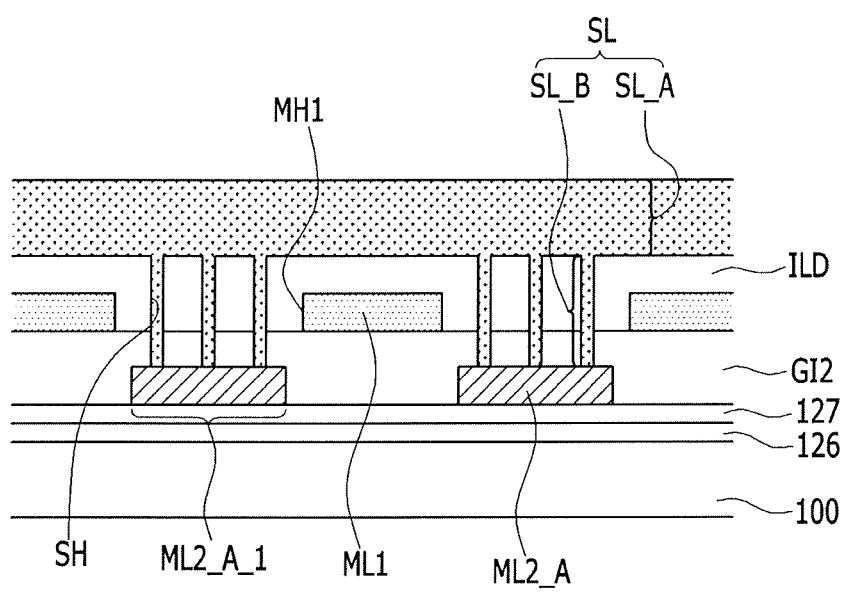
FIG. 7 is a cross-sectional view of FIG. 6, taken along line VII-VII.
Figure 8:
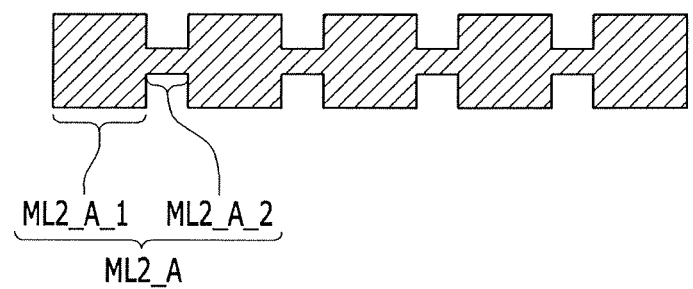
FIG. 8 is a top plan view of a second metal layer in area B of FIG. 6.
Figure 9:
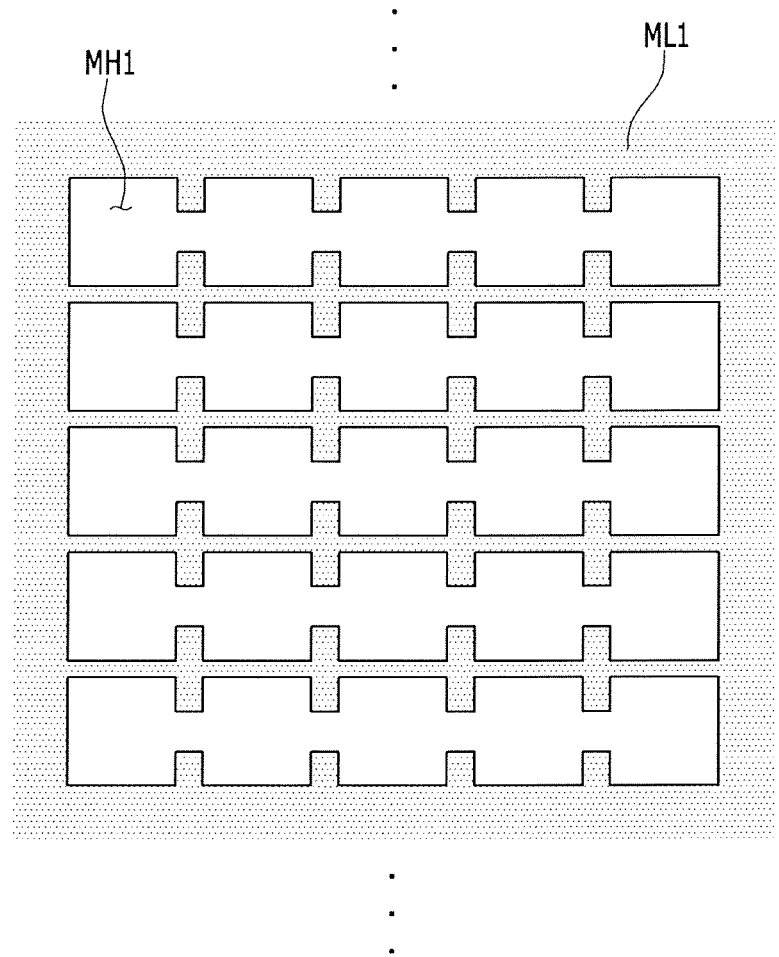
FIG. 9 is a top plan view of a first metal layer of FIG. 6.

FIG. 6 is an enlarged view of the area A of FIG. 1, FIG. 7 is a cross-sectional view of FIG. 6, taken along line VII-VII, FIG. 8 is a top plan view of a second metal layer in the area B of FIG. 6, and FIG. 9 is a top plan view of a first metal layer of FIG. 6.

Hereinafter, a layering structure of the sealant SL disposed in the peripheral area PA will be described in detail with reference to FIG. 6 to FIG. 9. For the purpose of convenience, in the description of the layering structure of the sealant SL in FIG. 6 to FIG. 9, detailed descriptions of the same structure as that of the sealant shown in FIG. 4 will be omitted.

Referring to FIG. 6 and FIG. 7, a second metal layer ML2_A is disposed above the gate insulation layer 127. In this case, the second metal layer ML2_A contacts a lower sealant SL_B disposed in a plurality of through-holes SH. Since the second metal layer ML2_A is disposed above the gate insulation layer 127, the plurality of through-holes SH that penetrate the first insulation layer GI2 and the second insulation layer ILD can be prevented from extending downward. For example, the plurality of through-holes SH can be prevented from extending to the gate insulation layer 127 and the substrate buffer layer 126.

In an exemplary embodiment of the present inventive concept, the second metal layer ML2_A is disposed above the gate insulation layer 127. As a result, the plurality of through-holes SH are prevented from extending downward. Thus, outgassing due to a residue of the planarization 124 (e.g., refer to FIG. 5), which is provided in the plurality of through-holes SH and then removed during a manufacturing process of the display device, can be suppressed. As described, when outgassing in the plurality of through-holes SH is suppressed, the lower sealant SL_B in the plurality of through-holes SH can be prevented from being lifted, and thereby preventing a weakening of adhesion. An occurrence of the outgassing in the plurality of through-holes SH will be described later.

As shown in FIG. 8, the second metal layer ML2_A may include a plurality of support portions ML2_A_1 and a plurality of connection portions ML2_A_2. In an exemplary embodiment of the present inventive concept, the second metal layer ML2_A disposed in the peripheral area PA may be disposed on the same layer as the first gate wires GW1 that are disposed in the display area DA.

The plurality of support portions ML2_A_1 may be spaced apart from one another and may remain parallel to one another. Each support portion of the plurality of support portions ML2_A_1 may have a polygonal shape. In FIG. 8, each support portion of the plurality of support portions ML2_A_1 has a quadrangular shape. For example, a support portion ML2_A_1 may have a square shape. However, exemplary embodiments of the inventive concept are not limited thereto, and each of the plurality of support portions ML2_A_1 may have various shapes such as triangular shape, a quadrangular shape, a pentagonal shape, a hexagonal shape, a heptangular shape, an octagonal shape, or the like.

In this case, as shown in FIG. 6 and FIG. 7, each support portion of the plurality of support portions ML2_A_1 may overlap the plurality of through-holes SH that pass through a plurality of openings MH1 provided in the first metal layer ML1.

In addition, each of the plurality of connection portions ML2_A_2 may connect a pair of support portions ML2_A_1 that neighbor one another among the plurality of support portions ML2_A_1. In this case, like the plurality of support portions ML2_A_1, each connection portion of the plurality of connection portions ML2_A_2 may also have a polygonal shape. In an exemplary embodiment of the inventive concept, each connection portion of the plurality of connection portions ML2_A_2 may have a quadrangular shape.

As shown in FIG. 8, an area of a flat surface of each support portion of the plurality of support portions ML2_A_1 is greater than the area of each connection portion of the plurality of connection portions ML2_A_2. Each connection portion of the plurality of connection portions ML2_A_2 may be electrically connected to each support portion of the plurality of support portions ML2_A_1. Further, the plurality of connection portions ML2_A_2 may electrically connect the plurality of support portions ML2_A_1. Thus, each of the plurality of connection portions ML2_A_2 may have a smaller flat surface than each of the plurality of support portions ML2_A_1 that prevent downward extension of the plurality of through-holes SH.

In an exemplary embodiment of the present inventive concept, the plurality of connection portions ML2_A_2 connect the plurality of support portions ML2_A_1 such that a concentration of static electricity in the second metal layer ML2_A can be prevented.

Referring back to FIG. 6 and FIG. 7, the first metal layer ML1 is disposed above the second metal layer ML2_A and is separated from the second metal layer ML2_A by a particular distance. For example, the first metal layer ML1 may be disposed on the first insulating layer GI2. Further, the first metal layer ML1 may have a plurality of openings MH1. In an exemplary embodiment of the present inventive concept, the first metal layer ML1 disposed in the peripheral area PA may be disposed on the same layer as that of the second gate wires GW2 disposed in display area DA.

As shown in FIG. 6, the second metal layer ML2_A is disposed in the plurality of openings MH1. For example, the first metal layer ML1 and the second metal layer ML2_A might not overlap one another. In addition, the plurality of openings MH1 of the first metal layer ML1 may overlap the second metal layer ML2_A.

As in an exemplary embodiment of the present inventive concept, when the first metal layer ML1 and the second metal layer ML2_A do not overlap one another, the first metal layer ML1 and the second metal layer ML2_A can be prevented from being short-circuited. When the first metal layer ML1 and the second metal layer ML2_A overlap one another, the first metal layer ML1 and the second metal layer ML2_A may short circuit if the first insulation layer GI2 is partially removed.

Referring to FIG. 9, the plurality of opening MH1 may respectively have shapes that correspond to the shape of the second metal layer ML2_A. Here, one opening MH1 of the first metal layer ML1 provides an open area corresponding to the shape of the second metal layer ML2_A that is shown in FIG. 8.

In addition, the first insulation layer GI2 that covers the second metal layer ML2_A may be disposed above the first substrate 100. In addition, the second insulating layer ILD that covers the first metal layer ML1 may be disposed above the first insulation layer GI2.

In an exemplary embodiment of the present inventive concept, the plurality of through-holes SH that simultaneously penetrate the first insulation layer GI2 and the second insulation layer ILD are formed in the first insulation layer GI2 and the second insulation layer ILD. In this case, the plurality of through-holes SH pass through the opening MH1 of the first metal layer ML1 and extend to the surface of the second metal layer ML2_A. For example, the plurality of through-holes SH extend to the surface of the support portion ML2_A_1 of the second metal layer ML2_A. For example, the plurality of through-holes SH pass through the opening MH1 of the first metal layer ML1 and may overlap the second metal layer ML2_A.

In addition, the sealant SL may be disposed on the second insulation layer ILD. In this case, the sealant SL may be divided into an upper sealant SL_A and a lower sealant SL_B. The upper sealant SL_A shows a portion disposed on the second insulation layer ILD, and the lower sealant SL_B shows a portion extended from the upper sealant SL_A to the second metal layer ML2_A. Further, the plurality of through-holes SH are filled by the lower sealant SL_B.

In an exemplary embodiment of the present inventive concept, the plurality of through-holes SH are filled by the lower sealant SL_B such that adhesion between the sealant SL and the first and second insulation layers GI1 and ILD can be enhanced. Compared to a case where the sealant SL is disposed only above the second insulation layer ILD, when the plurality of through-holes SH is filled by the lower sealant SL_B such that a contact area between the sealant SL and the first and second insulation layers GI2 and ILD is increased, mutual adhesion may be enhanced.

Hereinafter, an area where a sealant is disposed in a display device according to an exemplary embodiment of the present inventive concept will be described with reference to FIG. 10 and FIG. 11. In the description of an exemplary embodiment of the present inventive concept, configurations that are the same as those of the above-stated exemplary embodiment of the present inventive concept will not be further described.

Figure 10:
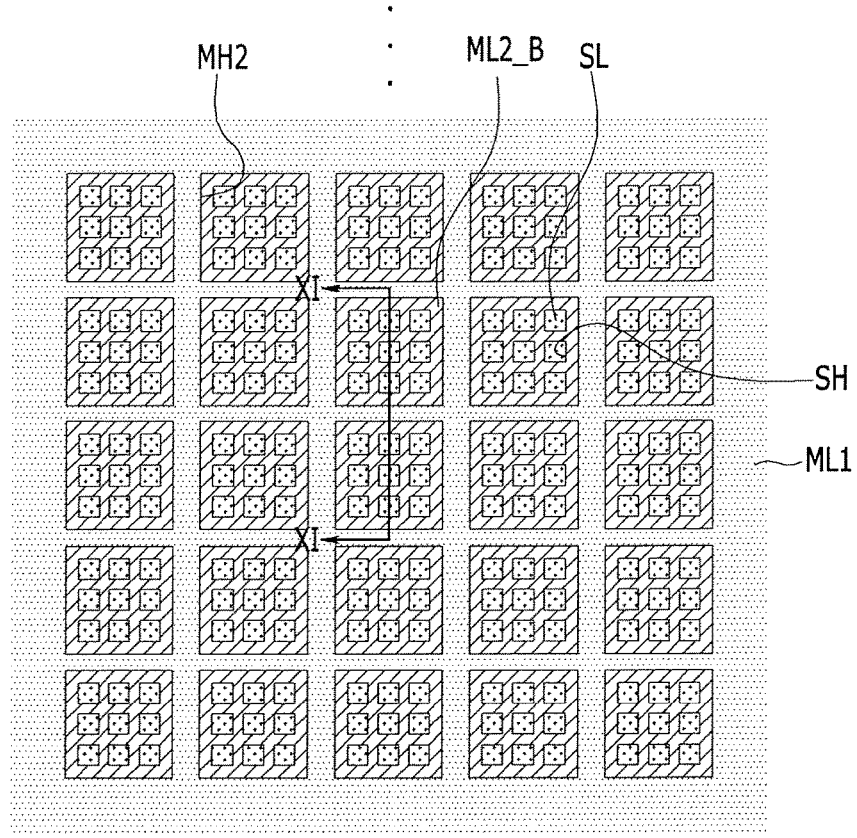
FIG. 10 is an enlarged view of an area where a sealant is disposed in a display device according to an exemplary embodiment of the present inventive concept.
Figure 11:
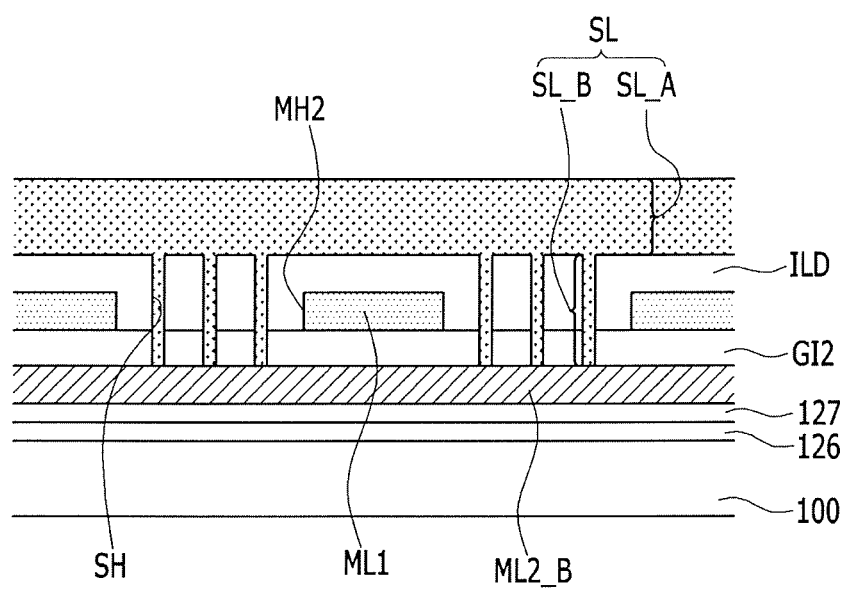
FIG. 11 is a cross-sectional view of FIG. 10, taken along line XI-XI.

FIG. 10 is an enlarged view of an area where a sealant is disposed in a display device according to an exemplary embodiment of the present inventive concept, and FIG. 11 is a cross-sectional view of line XI-XI of FIG. 10.

Referring to FIG. 10 and FIG. 11, a second metal layer ML2_B is disposed above a gate insulation layer 127, and contacts a lower sealant SL_B disposed in a plurality of through-holes SH. Since the second metal layer ML2_B is disposed above the gate insulation layer 127, the plurality of through-holes SH penetrating first and second insulation layers GI2 and ILD can be prevented from extending downward any further. For example, the plurality of through-holes SH can be prevented from extending to the gate insulation layer 127 and a substrate buffer layer 126.

Unlike the second metal layer ML2_A of the exemplary embodiment of the inventive concept described in FIG. 6 and FIG. 7, the second metal layer ML2_B of an exemplary embodiment of the present inventive concept may be include a shape of a flat substrate where no specific pattern is formed. For example, the second metal layer ML2_A in FIG. 6 and FIG. 7 is formed by gathering a plurality of patterns of the second metal layer ML2_A of FIG. 8, but the second metal layer ML2_B of an exemplary embodiment of the present inventive concept is wholly connected layer rather than being separated into multiple portions. For example, the second metal layer ML2_A in FIG. 6 and FIG. 7 may include multiple portions that are separated from one another.

In addition, a first metal layer ML1 is disposed above the second metal layer ML2_B and separated from the second metal layer ML2_B by a particular distance. The first metal layer ML1 may have a plurality of openings MH2. In the exemplary embodiment of the present inventive concept, quadrangular shaped openings MH2 are provided in left, right, top, and bottom directions with a constant length. For example, the openings MH2 may be provided in x-axis, y-axis and z-axis directions. Further, referring to FIG. 10, the plurality of openings MH2 may surround the plurality of through-holes SH.

A first insulation layer GI2 may be disposed on the second metal layer ML2_B such that the second metal layer ML2_B is covered by the first insulation layer GI2. Further, the first insulation layer GI2 may be disposed above the first substrate 100.

In an exemplary embodiment of the present inventive concept, a plurality of through-holes SH that simultaneously penetrate the first and second insulation layers GI2 and ILD are provided in the first and second insulation layers GI2 and ILD. In this case, the plurality of through-holes SH pass through the opening MH2 of the first metal layer ML1 and extend to the surface of the second metal layer ML2_B. For example, the plurality of through-holes SH may pass through the opening MH2 of the first metal layer ML1 and, thus, extend to the second metal layer ML2_B.

A sealant SL may be disposed above the second insulation layer ILD. In this case, the sealant SL may be divided into an upper sealant SL_A and a lower sealant SL_B. The upper sealant SL_A indicates a portion disposed above the second insulation layer ILD, and the lower sealant SL_B indicates a portion extended from the upper sealant SL_A and that filled in the plurality of through-holes SH.

In an exemplary embodiment of the present inventive concept, the plurality of through-holes SH is filled by the lower sealant SL_B such that adhesion between the sealant SL and the first and second insulation layers GI2 and ILD can be enhanced. Compared to a case where the sealant SL is disposed only above the second insulation layer ILD, when the plurality of through-holes SH is also filled by the lower sealant SL_B such that a contact between the sealant SL and the first and second insulation layers GI2 and ILD is increased, mutual adhesion may be enhanced.

Figure 12:
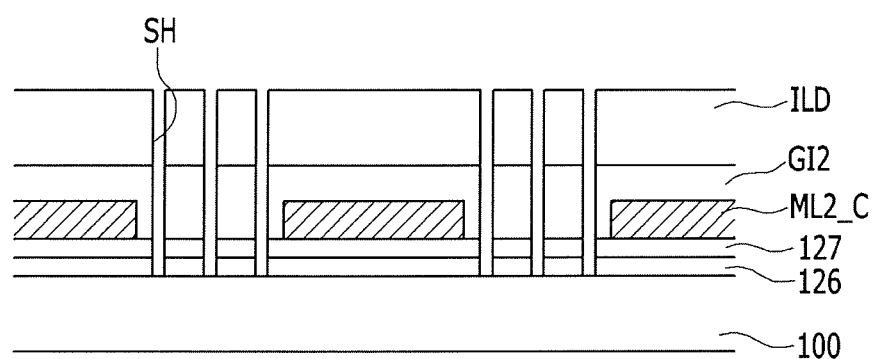
FIG. 12 to FIG. 14 sequentially illustrate a process for forming an area where a sealant is disposed in a display device according to an example.
Figure 13:
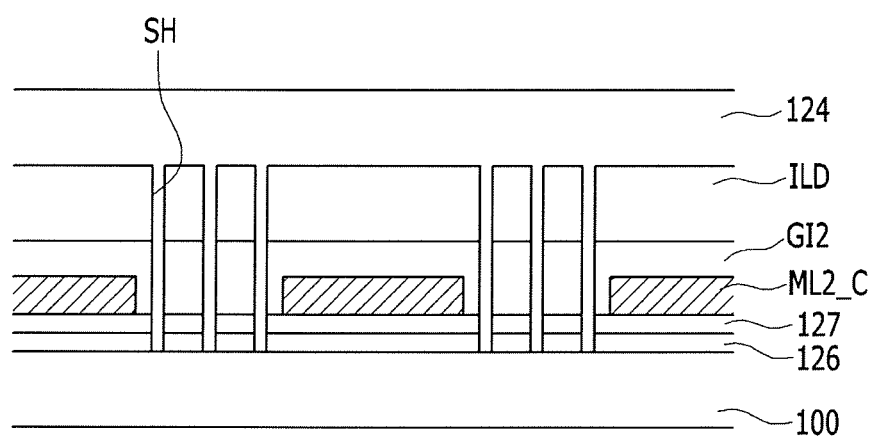
Figure 14:
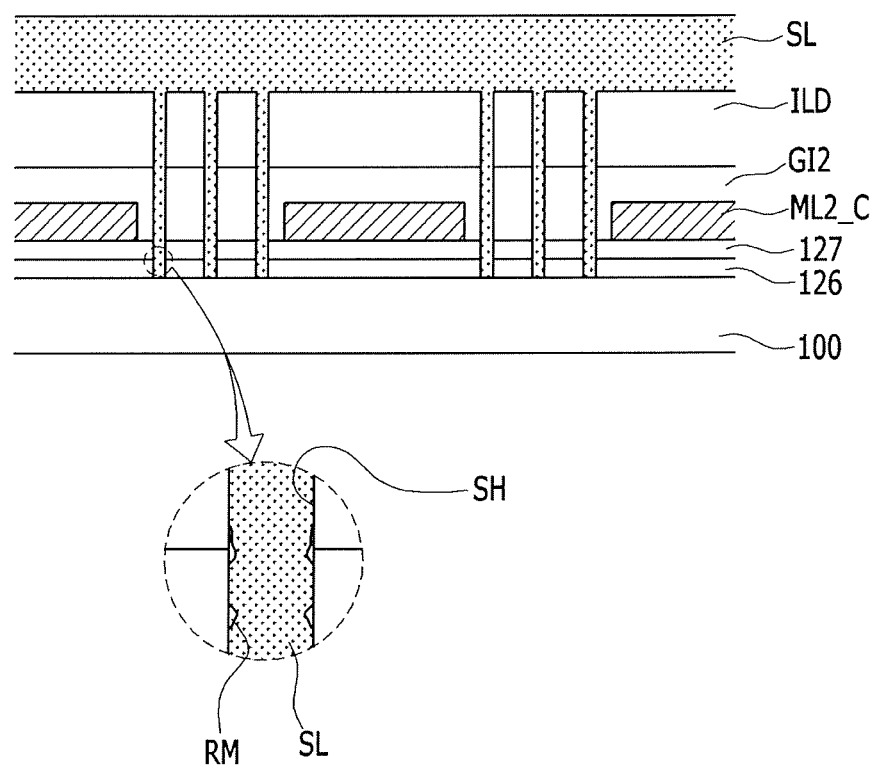

FIG. 12 to FIG. 14 sequentially show a process for forming an area where a sealant is disposed in a display device according to an example.

Hereinafter, referring to FIG. 12 to FIG. 14, a process in which outgassing occurs in the plurality of through-holes SH and, thus, a weakening in an adhesion of a sealant SL will be described.

Referring to FIG. 12, a plurality of through-holes SH penetrate openings of a second metal layer ML2_C and extend to a first substrate 100 in a display device according to the example. For example, the plurality of through-holes SH are also formed by penetrating a gate insulation layer 127 and a substrate buffer layer 126. In this case, the plurality of through-holes SH may be simultaneously formed when the contact hole 128a of FIG. 5 is formed.

Next, a planarization layer 124 is disposed on the second insulation layer ILD and in the plurality of through-holes SH. The planarization layer 124 of FIG. 13 and the planarization layer 124 of FIG. 5 are simultaneously formed. The planarization layer 124 of FIG. 13 may be removed during a process for forming a via hole 122a in the planarization layer 124 of FIG. 5.

Next, as shown in FIG. 14, when the planarization layer 124 is removed, the sealant SL may be disposed on the second insulation layer ILD and in the plurality of through-holes SH.

However, when the planarization layer 124 is being removed, a residue RM of the planarization layer 124 may remain in some of the through-holes of the plurality of through-holes SH. Compared to the above-stated exemplary embodiment of the present inventive concept (e.g., FIG. 11), the depth of the plurality of through-holes SH of the example illustrated in FIGS. 12-14 is deeper than that of the plurality of through-holes SH of the above-stated exemplary embodiment of the present inventive concept (e.g., FIG. 11) such that the planarization layer 124 in a lower area of the plurality of through-holes SH cannot be completely removed. For example, as shown in FIG. 14, the residue RM of the planarization layer 124 may remain in the lower area of the plurality of through-holes SH.

When the residue RM of the planarization layer 124 remains, outgassing may occur in the plurality of through-holes SH due to the residual planarization layer 124. Accordingly, adhesion between the sealant SL and the insulation layer may deteriorate.

Thus, in the exemplary embodiment of the present inventive concept, the depth of the plurality of through-holes SH can be decreased compared to the example. Accordingly, occurrence of outgassing in the plurality of through-holes SH can be suppressed such that the lower sealant SL_B in the plurality of through-holes SH can be prevented from being lifted, thereby preventing a weakening of adhesion.

In the display device according to the exemplary embodiment of the present inventive concept, the second metal layers ML2_A and ML2_B are disposed above the gate insulation layer 127 such that the plurality of through-holes SH can be prevented from extending downward. Accordingly, occurrence of outgassing due to the residue RM of the planarization layer 124 can be suppressed. When an occurrence of outgassing in the plurality of through-holes SH is suppressed, the lower sealant SL_B disposed in the plurality of through-holes SH can be prevented from being lifted, thereby preventing a weakening of adhesion.

While the present inventive concept has been described with reference to the exemplary embodiments thereof, it is to be understood by those of ordinary skill in the art that the present inventive concept is not limited to the disclosed exemplary embodiments, but, on the contrary, is intended to cover various modifications and equivalent arrangements included within the spirit and scope of the present inventive concept as defined by the following claims.

What is claimed is:

1. A display device comprising:
   a first substrate including a display area that displays an image and a peripheral area, in which no image is displayed, surrounding the display area;
   a first metal layer disposed above the first substrate in the peripheral area, and the first metal layer including a plurality of openings;
   a sealant disposed above the first metal layer; and
   a plurality of second metal layers disposed above the first substrate and below the first metal layer in the peripheral area, and respectively overlapping the openings of the first metal layer,
   wherein a plurality of though-holes pass through one of the openings of the first metal layer; and
   wherein a part of the sealant contacts the second metal layer through the plurality of trough-holes that penetrate first and second insulation layers.

2. The display device of claim 1, wherein a total area of the second metal layers is less than a total area of the plurality of openings.

3. The display device of claim 2, wherein the second metal layer comprises:
   a plurality of support portions that are each disposed in parallel with one another; and
   a plurality of connection portions disposed between a pair of support portions that are adjacent to one another, among the plurality of support portions, and connecting the pair of support portions to one another.

4. The display device of claim 3, wherein each of the plurality of support portions has a polygonal plane shape.

5. The display device of claim 3, wherein a total surface area of each of the plurality of support portions is greater than a total surface area of the plurality of connection portions.

6. The display device of claim 1, wherein
the first insulation layer is disposed in the peripheral area of the first substrate and covers the second metal layer, and
the second insulation layer is disposed between the first insulation layer and the sealant in the peripheral area of the first substrate, and covers the first metal layer disposed on the first insulation layer.

7. The display device of claim 1, wherein the plurality of through-holes overlap the second metal layers.

8. The display device of claim 7, wherein the sealant extends through the plurality of through-holes and contacts the second metal layer.

9. The display device of claim 1, further comprising:
a plurality of gate wires disposed above the display area of the first substrate, each extending in a first direction, and arranged in parallel with one another in a second direction that crosses the first direction; and
a plurality of second gate wires each extending in the first direction, and disposed between a pair of first gate wires that are adjacent to one another among the plurality of gate wires, respectively.

10. The display device of claim 9, wherein the pair of first gate wires and the plurality of second gate wires are provided in different layers.

11. The display device of claim 10, wherein the first metal layer is disposed on a same layer as that of the pair of first gate wires, and the second metal layer is disposed on a same layer as that of the plurality of second gate wires.

12. The display device of claim 10, wherein the first metal layer is disposed on a same layer as that of the plurality of second gate wires, and the second metal layer is disposed on a same layer as that of the pair of first gate wires.

13. The display device of claim 1, wherein a pixel of a plurality of pixels includes an organic light emitting element.

14. The display device of claim 1, further comprising a second substrate disposed above the first substrate, and, together with the sealant and the first substrate, enclosing a plurality of pixels.

15. The display device of claim 1, wherein the sealant comprises:
an upper sealant disposed above the first metal layer; and
a lower sealant extending from the upper sealant and disposed in the plurality of openings.

16. The display device of claim 1, wherein the part of the sealant contacts an upper surface of one of the second metal layer.

17. A display device comprising:
a substrate divided into a first area and a second area surrounding the first area;
a plurality of pixels disposed in the first area;
a bottom metal layer disposed above the substrate in the second area;
a first insulation layer disposed on the bottom metal layer;
a top metal layer disposed on the insulation layer and including an opening, wherein the bottom metal layer overlaps the opening; and
a sealant disposed above the top metal layer, wherein part of the sealant extends to the bottom metal layer through a plurality of through-holes which penetrate the first insulation layer through the opening to contact the bottom metal layer.

18. The display device of claim 17, wherein the top metal layer includes a plurality of openings provided above the bottom metal layer, and
wherein the bottom metal layer includes a plurality of portions separated from one another, wherein each portion is overlapping an opening of the plurality of openings.

19. The display device of claim 18, wherein the plurality of portions of the bottom metal layer comprises:
a plurality of support portions that are disposed in parallel with one another; and
a plurality of connection portions disposed between a pair of support portions that are adjacent to one another among the plurality of support portions and connecting the pair of support portions to one another.

20. The display device of claim 17, wherein the part of the sealant contacts an upper surface of one of the bottom metal layer.

* * * * *